United States Patent
Southard, II (10) Patent No.: US 9,267,745 B2
(45) Date of Patent: Feb. 23, 2016

(54) COMPOSITE HEAT SPREADER CONTAINING SYNTHETIC GRAPHITE SHEET AND COMPRESSED GRAPHITE LAYER JOINED WITHOUT ADHESIVE

(75) Inventor: John L. Southard, II, Norton, OH (US)

(73) Assignee: GrafTech International Holdings Inc., Independence, OH (US)

( * ) Notice: Subject to any disclaimer, the term of this patent is extended or adjusted under 35 U.S.C. 154(b) by 274 days.

(21) Appl. No.: 13/818,116

(22) PCT Filed: Sep. 20, 2011

(86) PCT No.: PCT/US2011/052269
§ 371 (c)(1),
(2), (4) Date: Apr. 15, 2013

(87) PCT Pub. No.: WO2012/040148
PCT Pub. Date: Mar. 29, 2012

(65) Prior Publication Data
US 2013/0213630 A1     Aug. 22, 2013

Related U.S. Application Data

(60) Provisional application No. 61/384,839, filed on Sep. 21, 2010.

(51) Int. Cl.
*H01L 23/373* (2006.01)
*F28F 21/02* (2006.01)
(Continued)

(52) U.S. Cl.
CPC ............. *F28F 21/02* (2013.01); *B32B 18/00* (2013.01); *C04B 35/522* (2013.01);
(Continued)

(58) Field of Classification Search
CPC ............ Y10T 428/30; C04B 2237/363; C04B 35/522; C04B 35/536
USPC ............ 165/185; 361/704; 428/216, 332, 408
See application file for complete search history.

(56) References Cited

U.S. PATENT DOCUMENTS

| | | | |
|---|---|---|---|
| 4,878,152 A | 10/1989 | Sauzade et al. | |
| 2005/0077000 A1* | 4/2005 | Norley et al. | 156/249 |

(Continued)

FOREIGN PATENT DOCUMENTS

| | | | |
|---|---|---|---|
| EP | 0296019 A1 | 12/1988 | |
| EP | 0360217 A2 | 3/1990 | |

(Continued)

OTHER PUBLICATIONS

Review Exfoliation of Graphite Journal of Materials Science 22 (1987) 4190-4198 D. D. L. Chung Department of Mechanical and Aerospace Engineering, State University of New York, Buffalo, New York 14260, USA.*

(Continued)

*Primary Examiner* — Archene Turner
(74) *Attorney, Agent, or Firm* — Rankin Hill & Clark LLP (57) ABSTRACT

A composite heat spreader (10) having an in-plane thermal conductivity of greater than 600 W/m*K and a thickness of greater than 50 microns, the composite heat spreader including a first element (20) which includes at least one sheet of compressed particles of exfoliated graphite having a density of at least about 1.4 grams/cc; and a second element (30) which includes at least one sheet of synthetic graphite having a density of at least 1.8 grams/cc and an in-plane thermal conductivity of at least 700 W/m*K, where the first element and the second element are joined into a composite sheet without the use of adhesives.

15 Claims, 4 Drawing Sheets

(51) Int. Cl.
B32B 18/00 (2006.01)
C04B 35/52 (2006.01)
C04B 35/536 (2006.01)

(52) U.S. Cl.
CPC ........... C04B 35/536 (2013.01); H01L 23/373 (2013.01); H01L 23/3735 (2013.01); *C04B 2235/77* (2013.01); *C04B 2235/787* (2013.01); *C04B 2235/9607* (2013.01); *C04B 2237/363* (2013.01); *C04B 2237/704* (2013.01); *C04B 2237/80* (2013.01); *H01L 2924/0002* (2013.01); *Y10T 156/1007* (2015.01)

(56) References Cited

U.S. PATENT DOCUMENTS

2006/0098413 A1* 5/2006 Capp et al. .................... 361/705
2007/0032589 A1 2/2007 Nishikawa
2009/0190312 A1* 7/2009 Katayama et al. ............ 361/708
2011/0045300 A1 2/2011 Tamaoki et al.

FOREIGN PATENT DOCUMENTS

EP 0397152 A1 11/1990
JP 2003-092384 A 3/2003
WO 2009/147771 A1 12/2009

OTHER PUBLICATIONS

WO 2009/147771 A1 (Tamaoki et al.) machine translation.*
Anonymous, "Papyex Flexible Graphite", Jan. 1, 1995, pp. 1-12, XP002617517.
Anonymous, "Sigraflex Produkte aus Flexibler Graphitfolie", Jan. 1, 1997, pp. 1, 3, 9-10, XP002617516.
International Search Report and Written Opinion dated Jan. 30, 2012, issued by the United States International Search Authority for PCT/US12/52269.

* cited by examiner

COMPOSITE HEAT SPREADER CONTAINING SYNTHETIC GRAPHITE SHEET AND COMPRESSED GRAPHITE LAYER JOINED WITHOUT ADHESIVE

TECHNICAL FIELD

An embodiment of the present disclosure relates to a heat spreader having an in-plane thermal conductivity of at least about 600 W/m*K; in some embodiments, the heat spreader of this disclosure is at least 50 microns in thickness. More specifically, the present disclosure relates to a heat spreader which comprises at least one expanded graphite layer and at least one synthetic graphite layer, where each expanded graphite layer includes at least one sheet of compressed particles of exfoliated graphite and each synthetic graphite layer includes at least one sheet selected from either pyrolytic graphite or sheets of graphitized polyimide film. In preferred embodiments, the heat spreader of the disclosure can be produced such that its thickness and in-plane thermal conductivity is appropriate to the specific application for which it is intended.

BACKGROUND ART

With the development of more and more sophisticated electronic devices, such as cell phones, small laptop computers, sometimes referred to as "netbooks," electronic or digital assistants, sometimes referred to as "smart phones," etc., including those capable of increasing processing speeds, display resolution, device features (such as cameras) and higher frequencies, relatively extreme temperatures can be generated. Indeed, with the desire for smaller devices having more complicated power requirements, and exhibiting other technological advances, such as microprocessors and integrated circuits in electronic and electrical components and systems as well as in other devices such as high power optical devices, thermal management is even more important. Microprocessors, integrated circuits, displays, cameras (especially those with integrated flashes, and other sophisticated electronic components typically operate efficiently only under a certain range of threshold temperatures. The excessive heat generated during operation of these components can not only harm their own performance, but can also degrade the performance and reliability of other components, especially adjacent components, and the overall system and can even cause system failure. The increasingly wide range of environmental conditions, including temperature extremes, in which electronic systems are expected to operate, exacerbates these negative effects.

In addition, the presence of heat-generating components can create hot spots, areas of higher temperature than surrounding areas. This is certainly true in displays, such as plasma display panels or LCDs, where temperature differentials caused by components or even the nature of the image being generated can cause thermal stresses which reduce the desired operating characteristics and lifetime of the device. In other electronic devices, hot spots can have a deleterious effect on surrounding components and can also cause discomfort to the user, such as a hot spot on the bottom of a laptop case where is sits on a users lap, or on the touch points on the keyboard, or the back of a cell phone or smart phone, etc. In these circumstances, heat dissipation may not be needed, since the total heat generated by the device is not extreme, but heat spreading may be needed, where the heat from the hot spot is spread more evenly across the device, to reduce or eliminate a hot spot.

With the increased need for thermal management and dissipation from electronic devices caused by these conditions, thermal management becomes an increasingly important element of the design of electronic products. As noted, both performance reliability and life expectancy of electronic equipment are inversely related to the component temperature of the equipment. What can complicate these issues, however, is the fact that different devices have different needs. For instance, some devices may need a heat spreader having an in-plane thermal conductivity of 600 W/m*K, while others many need a heat spreader having an in-plane thermal conductivity of 900 W/m*K, etc. (for the purposes of the present disclosure, in-plane thermal conductivity is determined by an Angstrom test method or by other known techniques. In general most techniques have an error measurement of no more than plus or minus ten (±10%) percent). In addition, some devices, especially large display devices such as plasma display or LCD televisions, can generate so much heat that a thin (i.e., less than 50 microns in thickness) heat spreader is "overwhelmed," such that heat passes through the thickness of the spreader, regardless of its in-plane thermal conductivity.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to commercially as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

The expanded graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the in-plane directions ranging along the length and width, i.e. along or parallel to the opposed, major surfaces comprises the "a" directions and the thermal and electrical properties of the sheet are very different, by orders of magnitude, for the "c" and "a" directions.

Pyrolytic graphite is a type of graphite which exhibits anisotropic properties. A factor in its anisotropic nature is the continuity of covalent bonding within the plane of the graphene layers. The predominant bonding between the graphene layers is more a function of Van Der Waals interactions than covalent bonding. A difference between the pyrolytic graphite and the natural graphite in this regard is the crystallite size in the pyrolytic graphite is much larger than in the natural graphite. This allows heat to be more efficiently conveyed in the X-Y plane in pyrolytic graphite. Further larger crystallite size means lower contact resistance in the pyrolytic vs. the natural graphite. Generally it is produced by heating a hydrocarbon nearly to its decomposition temperature, and permitting the graphite to crystallize (pyrolysis). One method is to heat synthetic fibers in a vacuum. Another method is to place seeds or a plate in the very hot gas to collect the graphite coating. Pyrolytic graphite sheets usually have a single cleavage plane, similar to mica, because the graphene sheets crystallize in a planar order, as opposed to graphite, which forms microscopic randomly-oriented zones. Because of this, pyrolytic carbon exhibits several unusual anisotropic properties; for the purposes of the present disclosure, however, it exhibits thermal anisotropy, as does expanded graphite sheets. Indeed, pyrolytic graphite sheets are, in general, more thermally conductive along the cleavage plane than expanded graphite, making it one of the best planar thermal conductors available.

Graphitized polyimide is used herein to refer to graphite films with high crystallinity and which can be created by the solid-state carbonization of an aromatic polyimide film followed by a high temperature heat treatment. Graphitized polyimide films also exhibit significant thermal anisotropy.

Disclosure of the Invention

The present disclosure relates to a composite heat spreader having an in-plane thermal conductivity of greater than 600 W/m*K or, in certain embodiments, greater than 1000 W/m*K, and a thickness of greater than 50 microns, or, in certain embodiments, greater than 80 microns. In a particular embodiment, the composite heat spreader has a first element which includes at least one sheet of compressed particles of exfoliated graphite having a density of at least about 1.4 grams/cc; and a second element which includes at least one sheet of synthetic graphite having a density of at least 1.8 grams/cc and an in-plane thermal conductivity of at least 700 W/m*K, where the first element and the second element are joined into a composite sheet without the use of adhesives. In some embodiments, the first element has a thickness of at least about 30 microns; in other embodiments, the first element has a thickness of at least 45 microns. In another embodiment, the second element has a density of at least 2.0 grams/cc. The second element can have an in-plane thermal conductivity of at least 1200 W/m*K.

In certain embodiments, the composite heat spreader includes two layers of the first element with at least one layer of the second element sandwiched therebetween. In other embodiments, the composite heat spreader of this disclosure has two layers of the second element with at least one layer of the first element sandwiched therebetween.

The disclosure includes a method for forming a composite heat spreader having an in-plane thermal conductivity of greater than 600 W/m*K and a thickness of greater than 30 microns, the method including providing a first element comprising at least one sheet of compressed particles of exfoliated graphite having a density of at least about 1.4 grams/cc; providing a second element comprising at least one sheet of synthetic graphite having a density of at least 1.8 grams/cc and an in-plane thermal conductivity of at least 700 W/m*K; and joining the first element and the second element into a composite sheet without the use of adhesives. The first element and the second element can be joined by calendering and/or burnishing. Other techniques in which the first element and the second element are compressed together may also be suitable.

In some embodiments, the second element has a density of at least 2.0 grams/cc and/or the second element has an in-plane thermal conductivity of at least 1200 W/m*K.

It is to be understood that both the foregoing general description and the following detailed description present embodiments of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operations of the invention. Other and further features and advantages of the present invention will be readily apparent to those skilled in the art upon a reading of the following disclosure when taken in conjunction with the accompanying drawings.

SELECTED DEFINITIONS

Expanded Graphite Sheet

Expanded graphite sheet is sometimes referred to as sheets of compressed particles of exfoliated or expanded graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

The graphite starting materials used to provide the expanded graphite sheet in the present disclosure may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the heat spreader of the present invention will have a purity of at least about 94%. In the most preferred embodiment, the graphite employed will have a purity of at least about 98%.

Compressed exfoliated graphite materials, such as graphite sheet and foil, are coherent, with good handling strength, and are suitably compressed, e.g. by roll pressing, to a thickness of about 0.05 mm to 3.75 mm and a typical density of about 0.4 to 2.0 g/cc or higher. Indeed, in order to be consider "sheet," the graphite should have a density of at least about 0.6 g/cc, and to have the flexibility required for the present invention, it should have a density of at least about 1.1 g/cc, more preferably at least about 1.6 g/cc. While the term "sheet" is used herein, it is meant to also include continuous rolls of material, as opposed to individual sheets.

If desired, sheets of compressed particles of exfoliated graphite can be treated with resin and the absorbed resin, after curing, enhances the moisture resistance and handling strength, i.e. stiffness, of the graphite article as well as "fixing" the morphology of the article. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

When employed as a heat spreader in accordance with the current disclosure, a sheet of compressed particles of exfoliated graphite should have a density of at least about 0.6 g/cc, more preferably at least about 1.1 g/cc, most preferably at least about 1.6 g/cc. From a practical standpoint, the upper limit to the density of the graphite sheet heat spreader is about 2.0 g/cc. The sheet should be no more than about 10 mm in thickness, more preferably no more than about 2 mm and most preferably not more than about 0.5 mm in thickness. That said, in certain embodiments, the expanded graphite sheet used in the present disclosure to form the first element is at least 30 microns is thickness, even at least 45 microns in thickness. When more than one sheet is employed to provide each sheet of the first element, the total thickness of the sheets taken together should preferably be at least 30 microns or, in some embodiments, at least 45 microns. The expanded graphite sheet should have an in-plane thermal conductivity of at least 200 W/m*K; in some embodiments, the expanded graphite sheet has an in-plane thermal conductivity of at least 400 W/m*K, or even 500 W/m*K. One graphite sheet suitable for use in forming the first element is commercially available as eGRAF material, from GrafTech International Holdings Inc. of Parma, Ohio.

Synthetic Graphite

As used in the present disclosure, the term "synthetic graphite" refers to graphitic materials having an in-plane thermal conductivity of at least about 700 W/m*K, and which can be as high as about 1500 W/m*K, or even as high as 2000 W/m*K or higher. Exemplary of such materials are those graphite materials referred to as pyrolytic graphite and graphitized polyimide films.

While pyrolytic graphite and graphitized polyimide films have been demonstrated to have relatively high thermal conductivity, as noted above, to date, it has not been possible to produce, especially on a commercial scale, such films having a thickness of greater than 100 microns. In addition, films having a surface area of about 300 square millimeters appear to be a commercial maximum for pyrolytic graphite and graphitized polyimide films. While the sheets can be laminated together to increase the thickness and even the surface area, the lamination process, especially the use of adhesives as would be required, can interfere with the thermal properties. As such, the practical uses of such synthetic graphite materials is limited, especially in high heat environments, where a high thermal capacity is needed.

Pyrolytic Graphite

By "pyrolytic graphite" is meant a graphitic material formed by the heat treatment of certain polymers as taught, for instance, in U.S. Pat. Nos. 3,317,338 and 4,054,708, the disclosures of which are incorporated herein by reference. In some embodiments, pyrolytic graphite refers to the carbon material produced through a gas-phase carbonization process. The gas-phase deposition of carbon occurs on a surface through the contact of hydrocarbons upon a substrate through the pyrolysis of hydrocarbons in the gas phase and deposition on the substrate surface. The large aromatic molecules produced by dehydrogenation and polymerization of hydrocarbons collide with the high-temperature substrate surface to form the deposit. Hydrogen is often used as a carrier gas with propane as a potential raw material with the concentration of propane depending upon the selected temperature and pressure conditions. The specific conditions of the reaction are selected for the prevention of soot and production of depositions, typically keeping the hydrocarbon gas at the lowest possible temperature where carbonization is completed when the gas contacts the substrate surface.

A factor which may influence the properties of pyrolytic graphite can be the selection of the substrate material as a plane of crystals is oriented virtually parallel to the deposition surface of the substrate. As such, specific properties of high anisotropy are achieved due to the linear orientation of the pyrolytic graphite crystals. Among the physical properties, the electrical resistivity, thermal conductivity, and coefficient of thermal expansion, all of which are largely determined by the orientation of the crystals, are also markedly dependent on the deposition temperature.

The differing densities can be the result of the synergistic effect of both deposition temperature and deposition rate. The crystals composing pyrolytic graphite become more regularly oriented upon heat treatment, with the size of the crystallites increasing proportionally with the temperature. As such, one can approach the crystalline orientation of ideal graphite with a subsequent heat treatment. Specifically, values approaching those of single crystal graphite are obtained through heat treatment at high temperatures.

Graphitized Polyimide Film

Graphitized polyimide film can be made from a polymer material as taught, for instance, in U.S. Pat. No. 5,091,025, the disclosure of which is incorporated herein by reference. Specifically, graphite films with high crystallinity can be created by the solid-state carbonization of an aromatic polyimide film followed by a high temperature heat treatment. This method of producing graphite film has attracted attention due to the fact that the films are carbonized without any change in shape, though a significant shrinkage does occur, and also because the carbon films can be converted to graphite through a subsequent heat treatment in an inert atmosphere.

A variety of polyimide films have been produced with different molecular structures to better fit the properties of the film to the specific application. This fact allows for differing properties of the resultant graphite film as the quality and composition of the polyimide film combined with the graphitization techniques control the resultant graphitic properties.

In the production of graphitized polyimide, a film such as a polyimide film is first cut and shaped to anticipate the subsequent shrinkage during the carbonization step. During carbonization, a large amount of carbon monoxide may evolve from the film accompanied by a substantial shrinkage of the film (often shrinkages substantially greater than 30% are observed).

The carbonization may take place as a two step process, the first step at a substantially lower temperature than the second step. During the first step of carbonizing a polyimide film, which occurs by bringing the film to a temperature of at least about 600° C., up to about 1800° C., over the course of at least two hours and up to about seven hours.

The graphitization process includes a high temperature (i.e., at least 2000° C. and up to about 3200° C.) heat treatment with the temperature of the heat treatment resulting in different alignment of the carbon atoms. Specifically, dependent upon the selected film, pores exist between the carbon layer stacks after graphitization at certain temperatures. For example, at 2450° C., a polyimide film, after the graphitization step, may still be turbostratic as flattened pores are oriented between the carbon layers. Conversely, at 2500° C., the same film would have the pores collapse resulting in a graphitic film with virtually perfect carbon layers. Sources of such graphitized polyimide film are Panasonic's PGS graphite sheet as well as GrafTech International Holdings Inc. SS1500 heat spreader.

BEST MODE FOR CARRYING OUT THE INVENTION

The composite heat spreader of the present disclosure has an in-plane thermal conductivity of greater than 600 W/m*K and a thickness of greater than 50 microns. In certain embodiments, the composite heat spreader includes a first element comprising at least one sheet of compressed particles of exfoliated graphite having a density of at least about 1.4 grams/cc. The first element can include a plurality of sheets of compressed particles of exfoliated graphite, such that the total thickness of the first element is at least 30 microns, or even at least 45 microns. The upper limit of the thickness of the first element depends on the end use and final desired thickness of the composite heat spreader, but is generally no more than about 125 microns.

The composite heat spreader also includes a second element, which comprises at least one sheet of synthetic graphite having a density of at least 1.8 grams/cc and an in-plane thermal conductivity of at least 700 W/m*K. In some embodiments, the synthetic graphite includes a plurality of layers, where the individual layers are either the same or different. In certain embodiments, the synthetic graphite is either pyrolytic graphite or graphitized polyimide film, or combinations of both (where the second element comprises a plurality of layers).

In an embodiment, the in-plane thermal conductivity of the second element is at least 1200 W/m*K; a practical (but not technical) upper limit of the in-plane thermal conductivity of the second element is 1800 W/m*K. The density of the second element is as high as 2.0 g/cc, or even as high as 2.2 g/cc or higher. While, as noted above, the synthetic graphite materials employed herein can be made in thicknesses of up to about 100 microns, in an embodiment they are employed in the practice of the present disclosure in thicknesses of up to about 50 microns. Such embodiments have exhibited dimensional stability and flexibility.

The first element and the second element are joined together to form the composite heat spreader of the disclosure, such that a major surface of the first element abuts a major surface of the second element. In certain preferred embodiments, the first element and the second element are joined into a composite sheet without the use of adhesives. In this way, thermal resistance at the joint between the two elements is minimized; the use of an adhesive or other material to join the two elements can often result in a reduced thermal transfer between the two elements, because most adhesives have a lower thermal conductivity than either the first element or the second element, and because it creates two joints (i.e., first element/adhesive and second element/adhesive) rather than one (i.e., first element/second element).

In certain embodiments, the first element and the second element are joined together to form the composite heat spreader by calendering or burnishing. In calendering, the two elements are provided and then run through a calendaring station, where they are subjected to one or more pressure rollers to form the composite heat spreader. In burnishing, the two elements are provided and then burnished, which is a process by which rotary pressure is applied to the elements to form the bond between the two.

The first element and the second element can be combined together in a manner so as to "engineer" the thermal conductivity of the composite heat spreader. That is, since two different materials are used, they can be combined in a variety of different ways to provide a composite heat spreader having any desired in-plane thermal conductivity between the in-plane thermal conductivities of the individual materials. This permits a composite heat spreader to be provided which is specific to the application (e.g., the specific electronic device and position) for which it is destined.

One manner in which this can be accomplished is by combining the first element and the second element in different arrangements for different uses. As noted, the first element, formed of expanded graphite sheet, can be thicker, but has a lower in-plane thermal conductivity, than the second element, which is formed of synthetic graphite. The thickness of the first element provides a higher thermal capacity, the ability to conduct heat within the material, than the second element. As such, in high heat environments, such as large display panels, the heat does not "overwhelm" the heat spreader and simply pass through the thickness without substantial spreading. Similarly, the second element provides higher in-plane thermal conductivity, such that more effective spreading is accomplished.

As such, the first and second element can be combined in a manner so as to provide the desired characteristics for the composite heat spreader, not possible with either of the elements individually. For instance, in an embodiment, the first element and the second element can be joined to provide two layers of the first element with at least one layer of the second element sandwiched therebetween. In another embodiment, the first element and the second element can be joined to provide two layers of the second element with at least one layer of the first element sandwiched therebetween. The skilled artisan will recognize that, in different embodiments, different combinations of the first element and the second element can be combined to provide the thickness (and, as such, the thermal capacity) and the in-plane thermal conductivity desired.

Figure 1:
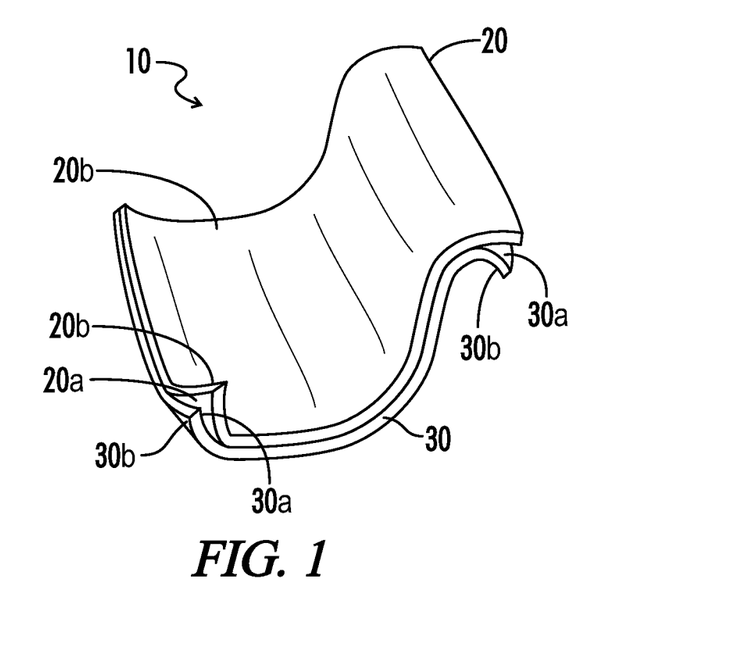
FIG. 1 is a perspective view of an embodiment of a composite heat spreader in accordance with the present disclosure, with the first and second elements partially peeled away from each other for illustrative purposes.

Turning now to the drawings, where like elements are given like reference numbers, FIG. 1 shows an embodiment of the composite heat spreader of the disclosure. In FIG. 1, a composite heat spreader 10 is shown, where composite heat spreader 10 comprises a first element 20, formed of a sheet of compressed particles of exfoliated graphite having a first major surface 20a and a second major surface 20b, and a second element 30, formed of a sheet of synthetic graphite having a first major surface 30a and a second major surface 30b. Composite heat spreader 10 is flexible, as shown, and formed by joining major surface 20a of first element 20 and major surface 30a of second element 30 (while FIG. 1 illustrates a corner of heat spreader 10 with first and second elements 20 and 30 peeled apart, the artisan will recognize that this is done for illustrative purposes and that in most embodiments, heat spreader 10 will not have sections which are peeled apart).

In one certain embodiment, first element 20 may comprise a sheet of a compressed mass of exfoliated graphite particles such as eGraf® material available from GrafTech International Holdings Inc. of Parma Ohio, having a thermal conductivity of no more than 600 W/m*K, more preferably from about 140 W/m*K to 600 W/m*K. In this embodiment, second element 130 may be comprised of synthetic graphite. Such synthetic graphite sheets may have a thermal conductivity ranging from at least about 700 W/m*K up to about 2000 W/m*K.

Figure 2:
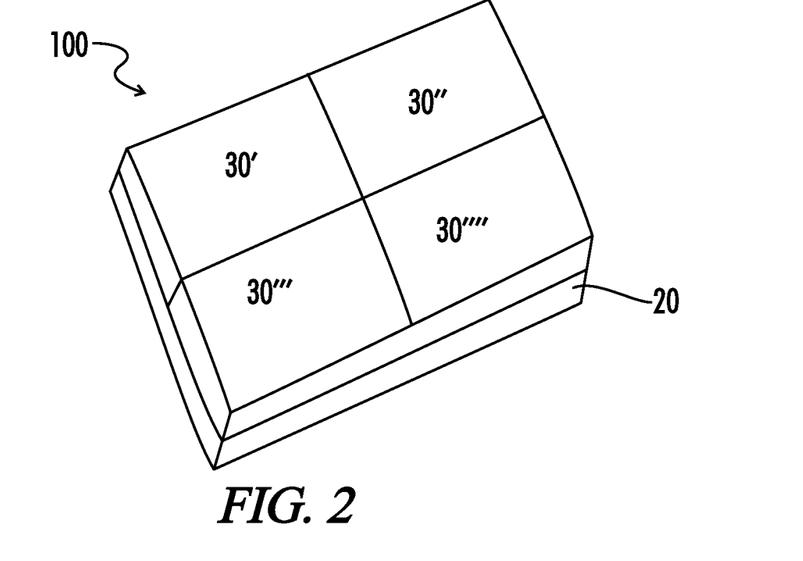
FIG. 2 is a perspective view of another embodiment of a composite heat spreader in accordance with the present disclosure.

FIG. 2 illustrates a different embodiment of composite heat spreader, denoted 100. Composite heat spreader 100 includes first element 20, formed of a sheet of compressed particles of exfoliated graphite. However, in this embodiment, given the fact that compressed articles of exfoliated graphite can be formed in continuous sheets but the surface area of synthetic graphite material is currently commercially limited to 300 square millimeters, composite heat spreader 100 includes a plurality of second elements, 30', 30", 30"', 30"", etc., since the surface area of first element 20 can be greater than that of the synthetic graphite sheets used to form second element 30. In this way, composite heat spreader 100 can have a surface area greater than that of the individual synthetic graphite sheets used to form second element 30', 30", 30"', 30"", etc. This is useful for applications where larger heat spreaders are desired, such as larger display panels.

In a preferred embodiment, first element 120 is formed of compressed particles of exfoliated graphite, as discussed above; such graphite materials can be conformable, meaning that the material may be used in applications which require a material which may be used in a non-planar arrangement. Stated another way, first element 20 may accommodate an arrangement which requires the material to conform in the x, y, and z directions at the same time and maintain such configuration.

Figure 3A:
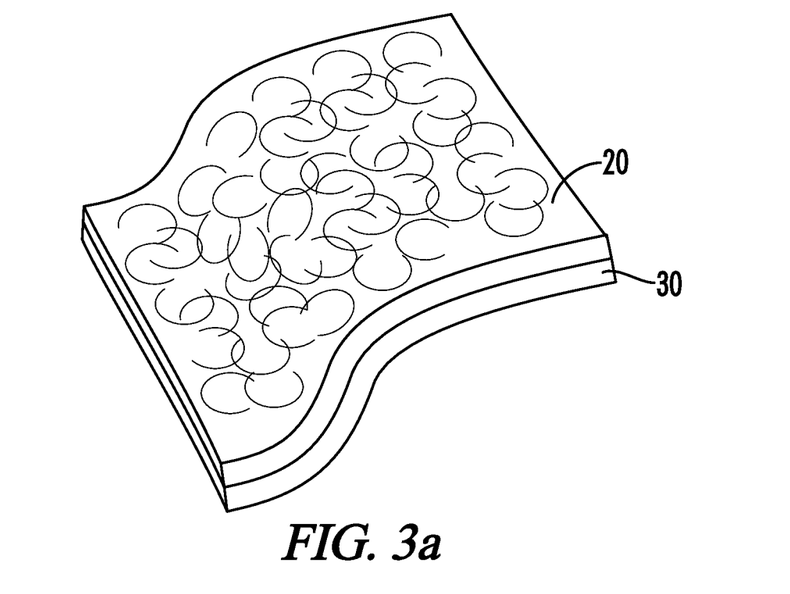
FIGS. 3a and 3b are perspective views of additional embodiments of a composite heat spreader in accordance with the present disclosure.
Figure 3B:
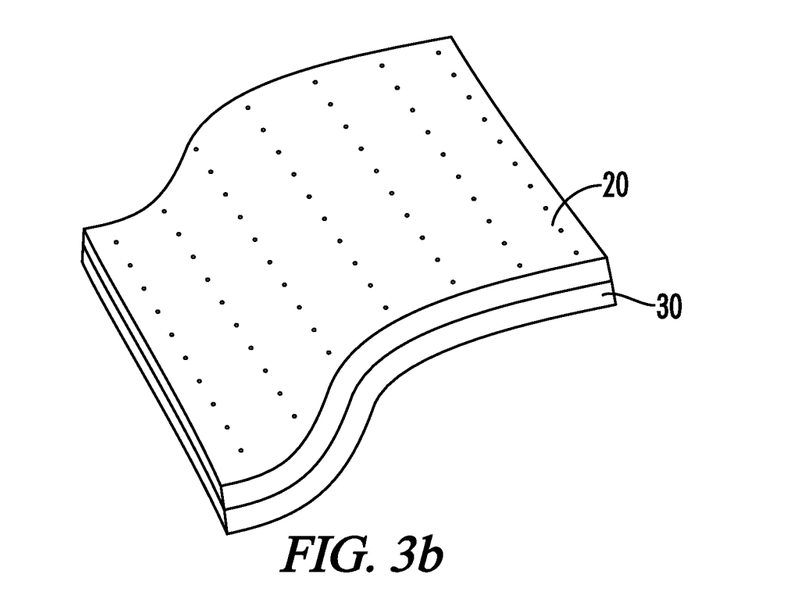

In another embodiment, illustrated in FIGS. 3a and 3b, one or both of first element 20 or second element 30 may include surface irregularities such as, but not limited to, knurling (i.e., FIG. 3a), perforations (i.e., FIG. 3b), or combinations thereof (not shown). While FIGS. 3a and 3b show surface irregularities on first element 20, it will be recognized that they can also be present on second element 30. In a particular embodiment, only one of sheets 20 or 30 includes such surface irregularities. In certain embodiments, the surface irregularities will result in a heat spreader 10 having increased through thickness thermal conductivity and/or electrical conductivity as compared to an equivalent heat spreader without surface irregularities.

Figure 4:
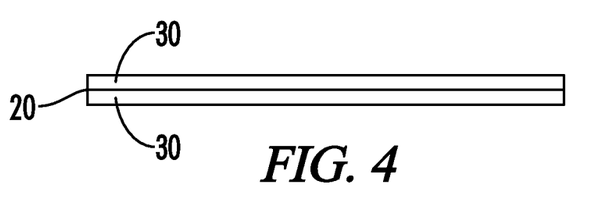
FIG. 4 is a perspective view of an embodiment of a composite heat spreader in accordance with the present disclosure, having an additional second element.

Referring now to FIG. 4, in certain embodiments, heat spreader 10 can include two second elements 30, such that first element 20 is sandwiched between a pair of second elements 30. Likewise, in other embodiments, heat spreader 10 can include two first elements 20, such that second element 30 is sandwiched between a pair of first elements 20 (not shown). In this manner, as discussed above, the properties and characteristics of the heat spreader of the present disclosure can be varied, by varying the specific arrangement of first element(s) 20 and second element(s) 30, as well as the specific properties of each element, such as thickness, density, thermal conductivity, etc.

Figure 5:
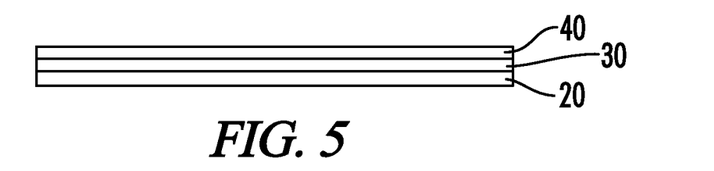
FIG. 5 is a perspective view of an embodiment of a composite heat spreader in accordance with the present disclosure, having a rigidizing layer.

FIG. 5 illustrates the embodiment where a third element 40, such as a metal foil or other like layer can be positioned on heat spreader 10, abutting second element 30 or first element 20 (not shown). Third element 40 can be a rigidizing layer, to help maintain heat spreader in a specific shape, or it can provide other desirable characteristics to heat spreader 10. Third element 40 can be a metal, like aluminum or copper, a ceramic, or other desirable materials.

Figure 6A:
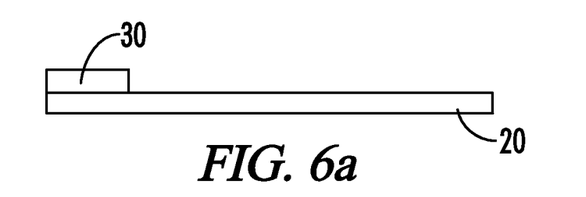
FIGS. 6a-6d are perspective views of additional embodiments of a composite heat spreader in accordance with the present disclosure.
Figure 6B:
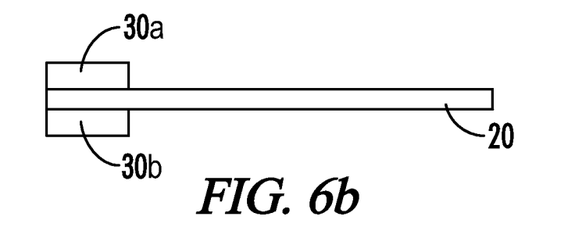
Figure 6C:
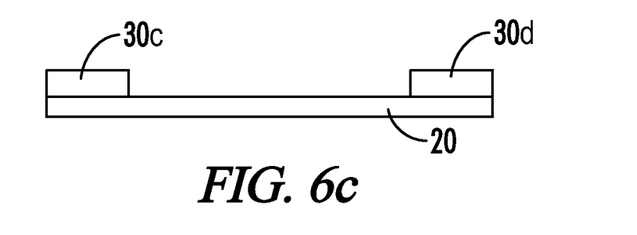
Figure 6D:
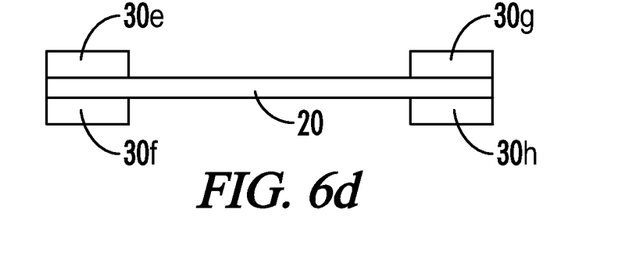

FIGS. 6a-6d illustrate additional embodiments of heat spreader 10 of the present disclosure. In these embodiments, first element 20 and second element 30 are not co-extensive. Rather, second element 30 can be positioned in contact with a portion of first element 20 as shown in FIG. 6a, as second element 30a and 30b as shown in FIG. 6b, as second element 30c and 30d as shown in FIG. 6c, or as second element 30e, 30f, 30g and 30h as shown in FIG. 6d. As would be apparent to the skilled artisan, arrangements such as the foregoing, as well as others which would also be apparent, can provide further variability in the properties and characteristics of heat spreader 10. In addition, given the flexibility of first element 20, a more flexible and malleable heat spreader 10 can be produced. Contrariwise, in other embodiments, first element 20 can be in contact with only a portion of second element 30 in similar fashion (not shown).

Figure 7A:
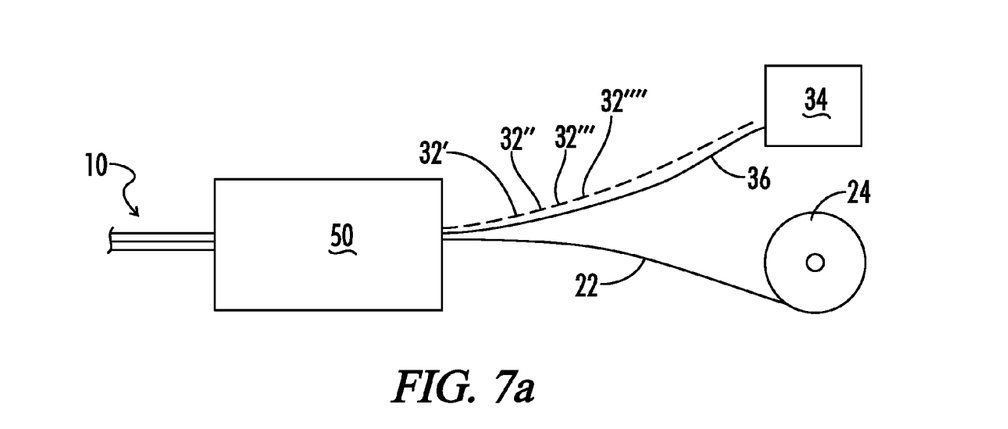
FIGS. 7a and 7b are schematic representations of embodiments of apparatus for forming the composite heat spreader of the present disclosure.
Figure 7B:
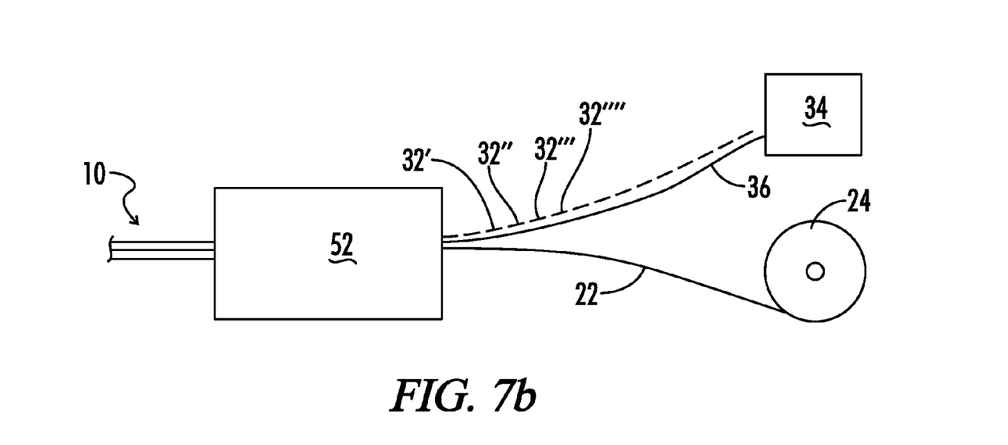

FIGS. 7a and 7b illustrate apparatus for producing the composite heat spreader 10 of the present disclosure, where a continuous sheet of compressed particles of exfoliated graphite 22 is provided from roll of compressed particles of exfoliated graphite 24; similarly, sheets of synthetic graphite 32', 32", 32"', 32"" etc. are provided from source of synthetic graphite 34. The individual sheets of synthetic graphite 32', 32", 32"', 32"", etc. are joined to continuous sheet of compressed particles of exfoliated graphite 22 at calendering station (50 in FIG. 7a) or burnishing station (52 in FIG. 7b) without adhesive to form heat spreader 10.

The production of a continuous roll of composite heat spreader (such as composite heat spreader 100 in FIG. 2) can be effected by providing individual sheets of synthetic graphite, each of which is produced in non-continuous fashion, from a source such as denoted 34 in FIGS. 7a and 7b, and fed continuously to the continuous sheet of compressed particles of exfoliated graphite 22, to be joined at calendering station 50 or burnishing station 52 and, thereby, provide a continuous composite heat spreader 10.

The following example describes various embodiments of the present disclosure. Other embodiments within the scope of the claims herein will be apparent to one skilled in the art from consideration of the specification or practice of the invention as disclosed herein. It is intended that the specification, together with the drawings and example, be considered to be exemplary only, with the scope and spirit of the disclosure being indicated by the claims which follow the examples. In the examples, all percentages are given on a weight basis unless otherwise indicated.

Example

Composite heat spreaders in accordance with the present disclosure are prepared, using individual sheets of compressed particles of exfoliated graphite, denoted EG in the attached tables, and individual sheets of synthetic graphite, denoted SG in the attached tables. The characteristics of the individual sheets of EG and SG are indicated, as well as those of the composite heat spreader. The densities (pycnometer used to measure density) and thicknesses (Starret Tester Dialometer used to measure thickness) of the individual elements and of the composite heat spreaders produced are shown in Table 1:

TABLE 1

| | n | measured composite density g/cm3 | determined density component prior to forming composite (n) g/cm3 | measured composite thickness microns | component thickness (n)microns |
|---|---|---|---|---|---|
| Composite 1 | | | | | |
| SG-EG | SG | 1.64 | 2.23 (SG) | 76 | 20 (SG) |
| | EG | | 1.48 (EG) | | 56 (EG) |
| Composite 2 | | | | | |
| SG-EG-SG | SG | 1.84 | 2.23 (SG) | 93 | 39 (SG) |
| | NG | | 1.62 (EG) | | 54 (EG) |
| Composite 3 | | | | | |
| EG-SG-EG | SG | 1.72 | 2.23 (SG) | 119 | 20 (SG) |
| | NG | | 1.64 (EG) | | 99 (EG) |

The thermal conductivity (K) of the individual elements and of the composite heat spreaders produced are shown in Table 2 (the Angstrom test method was used to K):

TABLE 2

| | Thickness (composite) Microns | component thickness (n) Microns | Component K(n) W/m*K | K(composite) W/m*K |
|---|---|---|---|---|
| Composite 1 | | | | |
| SG-EG | 76 | 20 (SG) | 1550 (SG) | 633 |
| | | 56 (EG) | 359 (EG) | |
| Composite 2 | | | | |
| SG-EG-SG | 93 | 39 (SG) | 1550 (SG) | 866 |
| | | 54 (EG) | 392 (EG) | |
| Composite 3 | | | | |
| EG-SG-EG | 119 | 20 (SG) | 1550 (SG) | 572 |
| | | 99 (EG) | 397 (EG) | |

Thus, as shown, composite heat spreaders can be produced using the present disclosure having differing thicknesses and in-plane thermal conductivities.

All references cited in this specification, including without limitation, all papers, publications, patents, patent applications, presentations, texts, reports, manuscripts, brochures, books, internet postings, journal articles, periodicals, and the like, are hereby incorporated by reference into this specification in their entireties. The discussion of the references herein is intended merely to summarize the assertions made by their authors and no admission is made that any reference constitutes prior art. Applicants reserve the right to challenge the accuracy and pertinence of the cited references.

Although preferred embodiments of the disclosure have been described using specific terms, devices, and methods, such description is for illustrative purposes only. The words used are words of description rather than of limitation. It is to be understood that changes and variations may be made by those of ordinary skill in the art without departing from the spirit or the scope of the present disclosure, which is set forth in the following claims. In addition, it should be understood that aspects of the various embodiments may be interchanged both in whole or in part. Therefore, the spirit and scope of the appended claims should not be limited to the description of the preferred versions contained therein.

What is claimed is:

1. A composite heat spreader having an in-plane thermal conductivity of greater than 600 W/m*K and a thickness of greater than 50 microns, the composite heat spreader comprising:
   a. a first element comprising at least one sheet of compressed particles of exfoliated graphite having a density of at least 1.4 grams/cc; and
   b. a second element comprising at least one sheet of synthetic graphite having a density of at least 1.8 grams/cc and an in-plane thermal conductivity of at least 700 W/m*K, wherein the first element and the second element are joined into a composite sheet without the use of adhesives.

2. The composite of claim 1, wherein the first element has a thickness of at least 30 microns.

3. The composite of claim 1, wherein the second element has a density of at least 2.0 grams/cc.

4. The composite of claim 3, wherein the second element has an in-plane thermal conductivity of at least 1200 W/m*K.

5. The composite of claim 1, wherein the composite heat spreader has an in-plane thermal conductivity of greater than 1000 W/m*K.

6. The composite of claim 5, wherein the composite heat spreader has a thickness of at least 80 microns.

7. The composite of claim 6, wherein the first element has a thickness of at least 45 microns.

8. The composite of claim 7, wherein the second element has a thickness of no more than 50 microns.

9. The composite of claim 1, which comprises two layers of the first element with at least one layer of the second element sandwiched therebetween.

10. The composite of claim 1, which comprises two layers of the second element with at least one layer of the first element sandwiched therebetween.

11. A method for forming a composite heat spreader having an in-plane thermal conductivity of greater than 600 W/m*K and a thickness of greater than 50 microns, the method comprising:
   a. providing a first element comprising at least one sheet of compressed particles of exfoliated graphite having a density of at least 1.4 grams/cc;
   b. providing a second element comprising at least one sheet of synthetic graphite having a density of at least 1.8 grams/cc and an in-plane thermal conductivity of at least 700 W/m*K; and
   c. joining the first element and the second element into a composite sheet without the use or adhesives.

12. The method of claim 11, wherein the first element and the second element are joined by calendering or burnishing.

13. The method of claim 11, wherein the second element has a density of at least 2.0 grams/cc.

14. The method of claim 13, wherein the second element has an in-plane thermal conductivity of at least 1200 W/m*K.

15. The method of claim 11, wherein the composite has a thickness of at least 80 microns.

* * * * *